(12) United States Patent
Kim

(10) Patent No.: US 6,925,625 B2
(45) Date of Patent: Aug. 2, 2005

(54) METHOD AND APPARATUS FOR GROUPING FLIP-FLOPS BY TIMING

(75) Inventor: Ghun Kim, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 82 days.

(21) Appl. No.: 10/461,666

(22) Filed: Jun. 12, 2003

(65) Prior Publication Data

US 2004/0255256 A1 Dec. 16, 2004

(51) Int. Cl.$^7$ .............................................. G06F 17/50
(52) U.S. Cl. .............................. 716/10; 716/2; 716/5; 716/6; 716/11
(58) Field of Search ........................... 716/2, 5–6, 8–14

(56) References Cited

U.S. PATENT DOCUMENTS

| | | | | |
|---|---|---|---|---|
| 5,896,300 A | * | 4/1999 | Raghavan et al. | 716/10 |
| 5,999,716 A | * | 12/1999 | Toyonaga | 716/10 |
| 6,286,126 B1 | * | 9/2001 | Raghavan et al. | 716/6 |
| 6,536,024 B1 | * | 3/2003 | Hathaway | 716/6 |
| 6,782,520 B1 | * | 8/2004 | Igusa et al. | 716/9 |

* cited by examiner

*Primary Examiner*—Vuthe Siek
(74) *Attorney, Agent, or Firm*—Park, Vaughan & Fleming, LLP; Edward S. Grundler

(57) ABSTRACT

One embodiment of the present invention provides a system that facilitates placing flip-flops in an integrated circuit based on timing requirements. The system operates by first receiving a netlist for flip-flop connectivity. Next, the system determines a metal layer class definition for each signal in the netlist based upon timing requirements of a corresponding flip-flop. The system then classifies a flip-flop instance using the metal layer class definition by defining a flip-flop type for each flip-flop instance and associating the flip-flop with a group of other flip-flops that have a same metal layer class definition. Finally, determining a position for the group by replacing an existing repeater in the integrated circuit with the group of flip-flops.

12 Claims, 4 Drawing Sheets

METHOD AND APPARATUS FOR GROUPING FLIP-FLOPS BY TIMING

BACKGROUND

1. Field of the Invention

The present invention relates to the design of integrated circuits. More specifically, the present invention relates to a method and an apparatus for grouping flip-flops by timing during the design of an integrated circuit.

2. Related Art

The process of designing integrated circuits, particularly central processing units, involves a large number of operations. During the design process, hundreds of millions of transistors and associated signal lines may need to be incorporated into a working layout. While many of these operations can be automated, some operations remain largely manual operations, and are hence time-consuming and prone to human error.

One of these manual operations involves placing flip-flops between circuit blocks of the integrated circuit. Current methods for placing flip-flops do not associate flip-flops with metal layers in the integrated circuit.

Integrated circuits typically have several metal layers, wherein each layer has a different width and spacing. The length, width, and spacing of the metal layer wires interconnecting the various devices and blocks on the integrated circuit all affect the RC parasitics and, thus, the timing of the signals. Hence, associating flip-flops with specific metal layers is critical for timing in the circuit and therefore affects performance of the circuit. Unfortunately, at the present moment, the process of determining the correct metal layer for a flip-flop is a manual operation, which is time-consuming and prone to error.

Hence, what is needed is a method and an apparatus for associating flip-flops with metal layers without the problems described above.

SUMMARY

One embodiment of the present invention provides a system that facilitates placing flip-flops in an integrated circuit based on timing requirements. The system operates by first receiving a netlist for flip-flop connectivity. Next, the system determines a metal layer class definition for each signal in the netlist based upon timing requirements of a corresponding flip-flop. The system then classifies a flip-flop instance using the metal layer class definition by defining a flip-flop type for each flip-flop instance and associating the flip-flop with a group of other flip-flops that have a same metal layer class definition. Finally, the system determines a position for the group by replacing an existing repeater in the integrated circuit with the group of flip-flops.

In a variation of this embodiment, the system extracts resistor-capacitor (RC) parasitic data for each I/O pin of each block on the integrated circuit. The system then uses the RC parasitic data to determine signal timing at each I/O pin.

In a further variation, the system calculates a wire delay for each I/O signal line used for interconnecting blocks on the integrated circuit.

In a further variation, calculating the wire delay for each I/O signal line involves using a wire parasitic equation.

In a further variation, receiving the netlist involves receiving a hierarchical block placement for blocks on the integrated circuit.

In a further variation, the hierarchical block placement includes a repeater placement in a channel area of the integrated circuit.

In a further variation, the system searches for available flip-flop positions based on the repeater placement.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Data Flow

Figure 1:
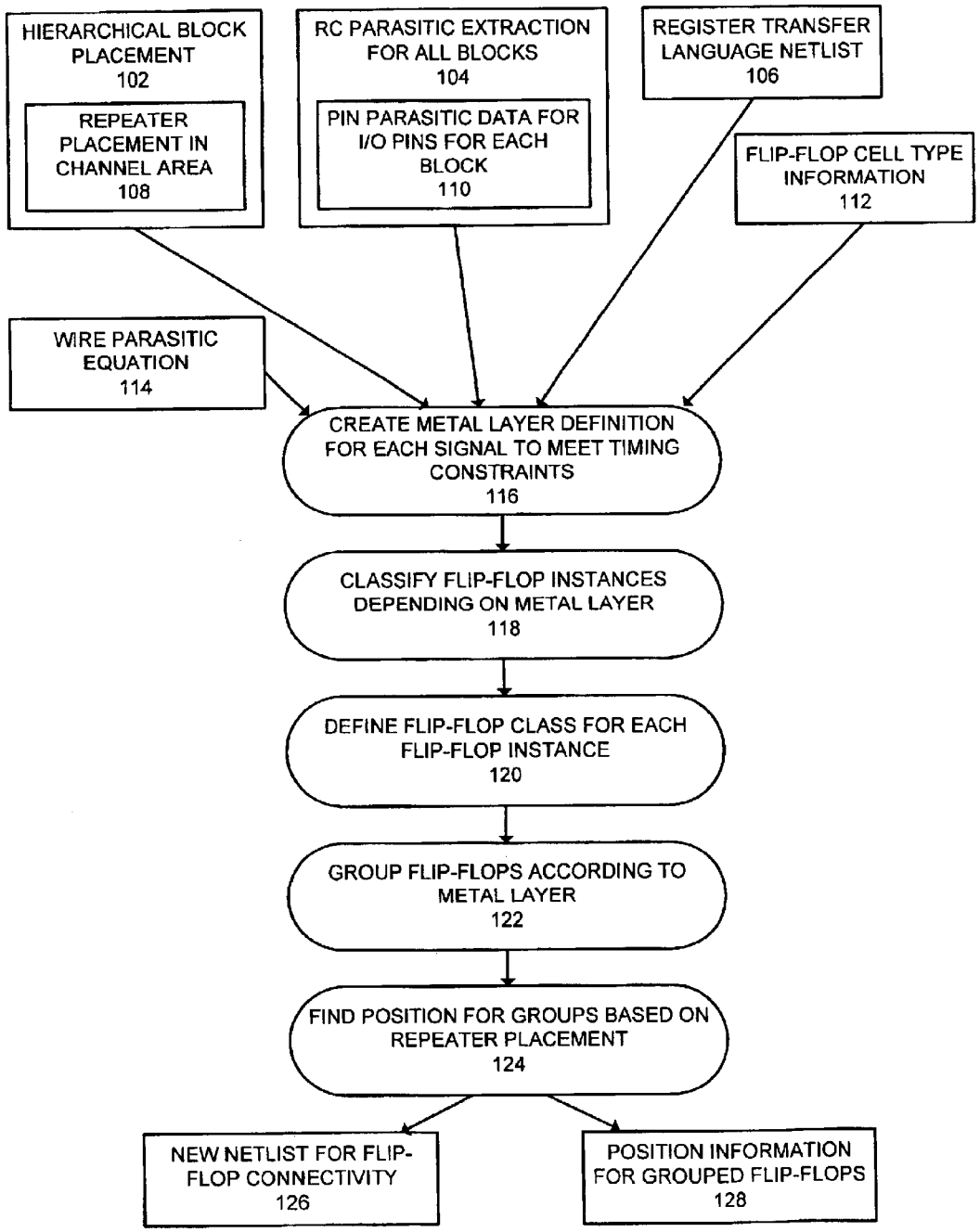
FIG. 1 illustrates the process of placing flip-flops in accordance with an embodiment of the present invention.

FIG. 1 illustrates the process of placing flip-flops in accordance with an embodiment of the present invention. This process starts with a number of types of input data, including hierarchical block placement data 102, which includes repeater placement in channel areas 108, resistance-capacitance (RC) parasitic extraction data 104, which includes pin parasitic data for input/output (I/O) pins for each block 110, register transfer language (RTL) netlists for the integrated circuit 106, flip-flop cell type information 112, and wire parasitic equation 114.

Hierarchical block placement data 102 specifies the placement of circuit blocks on the floor plan of the integrated circuit. These circuit blocks include I/O pins for interconnecting the circuit blocks with the other circuit blocks on the integrated circuit. Repeater placement data 108 specifies placements for repeaters within the channel areas between the circuit blocks. These repeaters can be used to regenerate signals between various circuit blocks.

RC parasitic extraction data 104 specifies RC parasitic data for each block on the integrated circuit. Pin parasitic data for I/O pins for each block 110 specifies the parasitic data for each I/O pin on the circuit blocks. RTL netlist 106 provides a netlist specifying interconnections between circuit elements of the integrated circuit.

Flip-flop cell type information 112 includes data for each flip-flop cell type specifying which metal layer each flip-flop is coupled to. Wire parasitic equation 114 is used to calculate the delay for a signal of a given length on a given metal layer.

The system uses these inputs to create class definitions for flip-flops to meet the timing constraints at 116 as described below in conjunction with FIGS. 2–5. Next, the system classifies flip-flop instances depending on the interconnection class at 118. This classification is based upon timing data and the flip-flop cell type information 112.

The system then defines the flip-flop type for each flip-flop instance at 120 and groups the flip-flops according to type at 122. Next, the system finds a position for these groups based upon repeater placement at 124. The output from operations 116, 118, 120, 122, and 124 includes a new netlist for flip-flop connectivity 126 and position information for grouped flip-flops 128.

Integrated Circuit Layout

Figure 2:
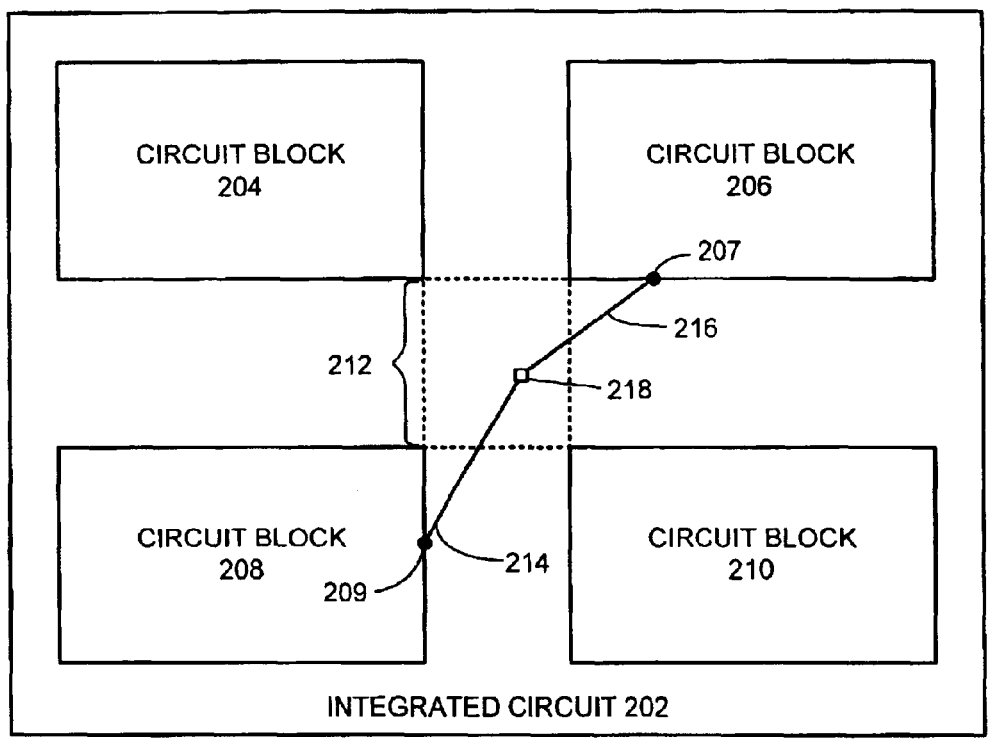
FIG. 2 illustrates an integrated circuit layout in accordance with an embodiment of the present invention.

FIG. 2 illustrates an integrated circuit layout in accordance with an embodiment of the present invention. Integrated circuit 202 includes circuit blocks 204, 206, 208, and 210. Area 212, outlined with a dotted line, includes the intersection of channels between circuit blocks 204, 206, 208, and 210. These channels, and area 212, include repeaters for signal regeneration of signals between circuit blocks 204, 206, 208, and 210.

I/O pins on these circuit blocks are interconnected to provide the overall functionality of integrated circuit 202. For example, I/O pin 207 on circuit block 206 may be interconnected with I/O pin 209 on circuit block 208. Note that timing constraints may preclude I/O pins 207 and 209 from being interconnected directly. Dividing the interconnection into segments 214 and 216 may be necessary to provide the correct timing relationship between I/O pins 207 and 209. Segments 214 and 216 are coupled through flip-flop 218.

Placing a Flip-Flop

Figure 3:
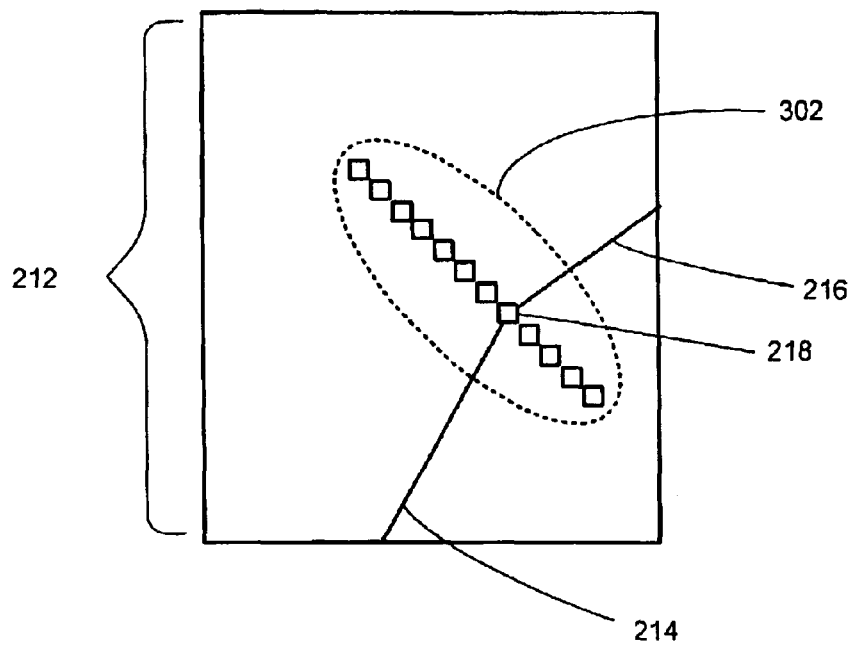
FIG. 3 illustrates possible placement locations for a flip-flop in accordance with an embodiment of the present invention.

FIG. 3 illustrates possible placement locations for a flip-flop in accordance with an embodiment of the present invention. Based upon the timing requirements for the signals on segments 214 and 216, flip-flop 218 can be located at several locations as indicated within area 302. Being able to select any one of these locations for flip-flop 218 is beneficial because a repeater or other flip-flop may need to be located at the best possible position. Placing flip-flops in this manner minimizes the area required for placing flip-flops and merges the flip-flops from different interconnections into a common area.

Overlapped Search Regions

Figure 4:
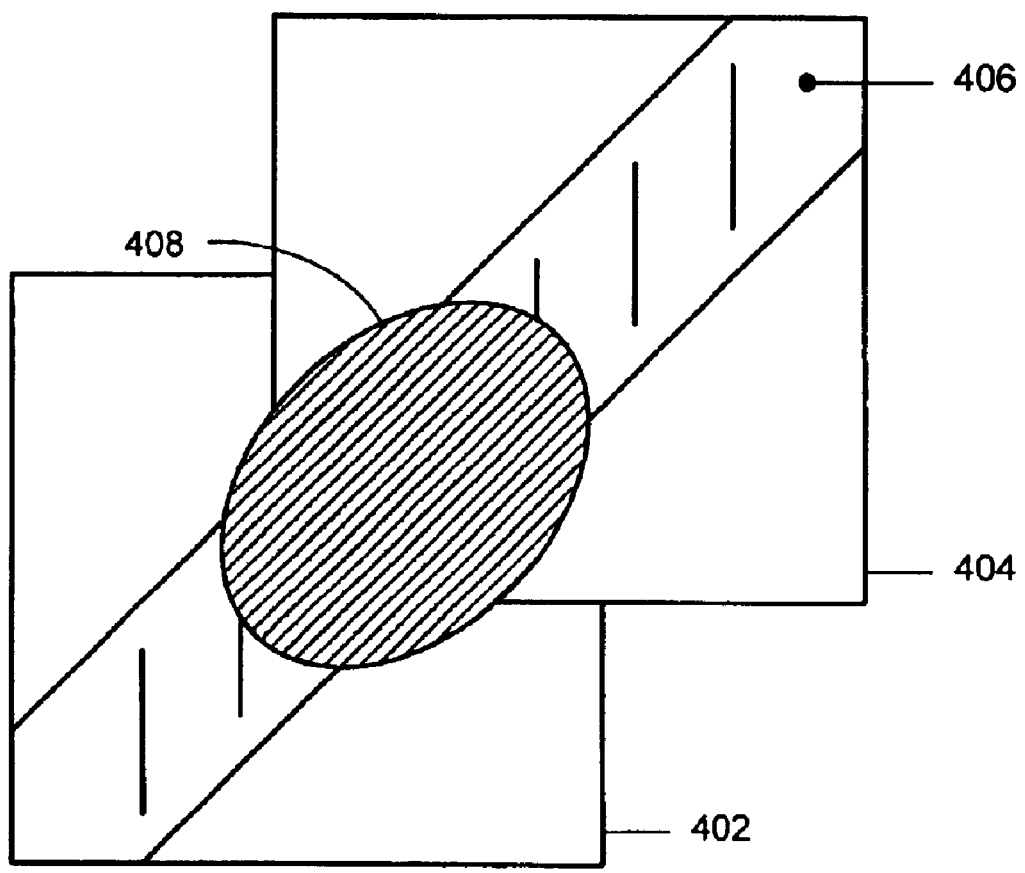
FIG. 4 illustrates an overlapped search region in accordance with an embodiment of the present invention.

FIG. 4 illustrates an overlapped search region in accordance with an embodiment of the present invention. Area 402 illustrates the region where the timing parameters can be met for circuit block 208 while area 404 illustrates the region where timing parameters can be met for circuit block 206. Diagonal area 406 represents the optimum locations for placing a flip-flop between circuit blocks 208 and 206. Area 408 includes the portions of area 406 that are colocated within both areas 402 and 404. Locations within area 408 are suitable for placing flip-flop 218.

Placing Flip-Flops

Figure 5:
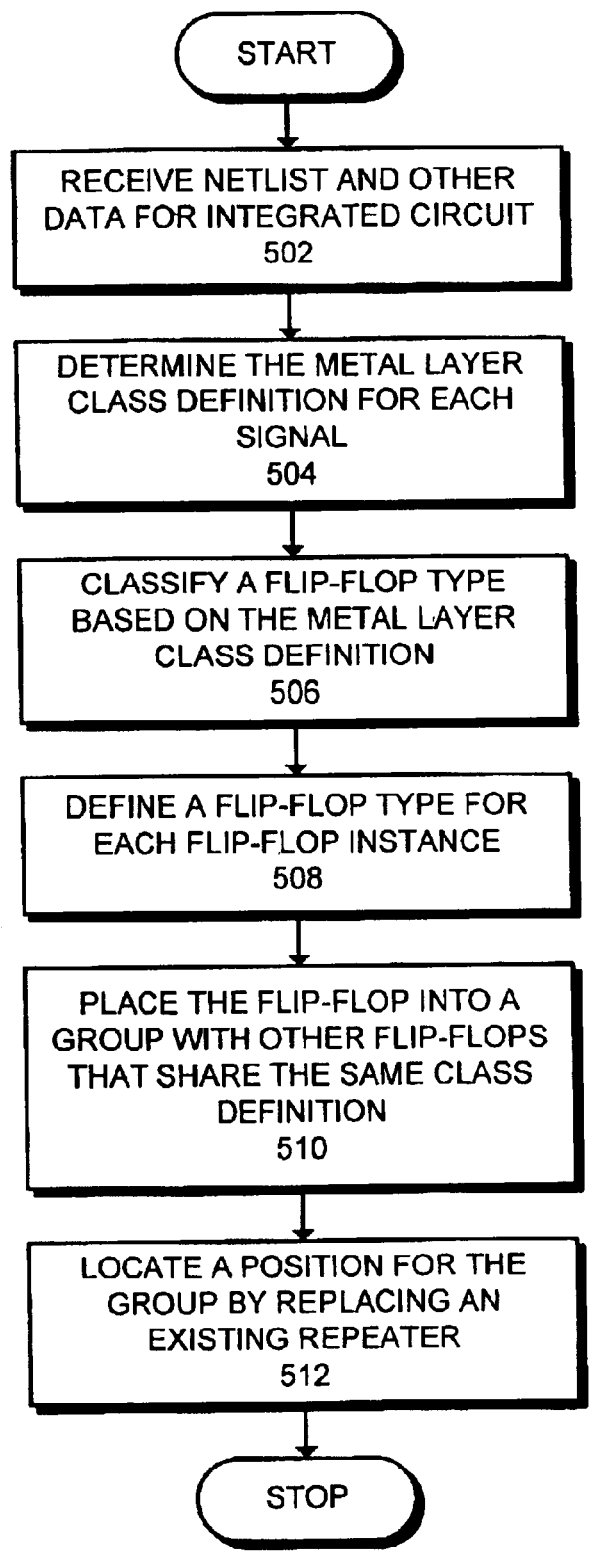
FIG. 5 presents a flowchart illustrating the process of placing flip-flops in accordance with an embodiment of the present invention.

FIG. 5 presents a flowchart illustrating the process of placing flip-flops in accordance with an embodiment of the present invention. The system starts when a netlist and other data are received for an integrated circuit (step 502). Next, the system determines the metal layer class definition for each signal used to interconnect I/O pins on circuit blocks of the integrated circuit (step 504). The system then classifies a corresponding flip-flop type based upon this metal layer class definition (step 506).

Next, the system defines a flip-flop type for each flip-flop instance (step 508). The system then places the flip-flop into a group with other flip-flops that share a common class definition (step 510). Finally, the system locates a position for the group by replacing an existing repeater within the channel between the circuit blocks with the group of flip-flops (step 512).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for placing flip-flops in an integrated circuit based upon timing, comprising:

receiving a netlist specifying flip-flop connectivity, wherein receiving the netlist includes receiving a hierarchical block placement for blocks on the integrated circuit, and wherein the hierarchical block placement includes a repeater placement in a channel area of the integrated circuit;

determining a metal layer class definition for a flip-flop in the netlist based upon timing requirements of the flip-flop;

classifying a flip-flop instance using the metal layer class definition;

defining a flip-flop type for each flip-flop instance;

associating the flip-flop with a group of other flip-flops that have a same metal layer class definition;

searching for available flip-flop positions based on the repeater placement; and determining a position for the group of flip-flops by replacing an existing repeater in the integrated circuit with the group of flip-flops.

2. The method of claim 1, further comprising:

extracting resistor-capacitor (RC) parasitic data for each I/O pin of each block on the integrated circuit; and using the RC parasitic data to determine signal timing at each I/O pin.

3. The method of claim 2, further comprising calculating a wire delay for each I/O signal line used for interconnecting blocks on the integrated circuit.

4. The method of claim 3, wherein calculating the wire delay for each I/O signal line involves using a wire parasitic equation.

5. A computer-readable storage medium storing instructions that when executed by a computer cause the computer to perform a method for placing flip-flops in an integrated circuit based upon timing, comprising:

receiving a netlist specifying flip-flop connectivity, wherein receiving the netlist includes receiving a hierarchical block placement for blocks on the intearated circuit, and wherein the hierarchical block placement includes a repeater placement in a channel area of the integrated circuit;

determining a metal layer class definition for a flip-flop in the netlist based upon timing requirements of the flip-flop;

classifying a flip-flop instance using the metal layer class definition;

defining a flip-flop type for each flip-flop instance;

associating the flip-flop with a group of other flip-flops that have a same metal layer class definition;

searching for available flip-flop positions based on the repeater placement; and determining a position for the group of flip-flops by replacing an existing repeater in the integrated circuit with the group of flip-flops.

6. The computer-readable storage medium of claim 5, the method further comprising:

extracting resistor-capacitor (RC) parasitic data for each I/O pin of each block on the integrated circuit; and using the RC parasitic data to determine signal timing at each I/O pin.

7. The computer-readable storage medium of claim 6, the method further comprising calculating a wire delay for each I/O signal line used for interconnecting blocks on the integrated circuit.

8. The computer-readable storage medium of claim 7, wherein calculating the wire delay for each I/O signal line involves using a wire parasitic equation.

9. An apparatus for placing flip-flops in an integrated circuit based upon timing, comprising:

a receiving mechanism configured to receive a netlist specifying flip-flop connectivity, wherein receiving the netlist includes receiving a hierarchical block placement for blocks on the integrated circuit, and wherein the hierarchical block placement includes a repeater placement in a channel area of the integrated circuit;

a determining mechanism configured to determine a metal layer class definition for a flip-flop in the netlist based upon timing requirements of the flip-flop;

a classifying mechanism configured to classify a flip-flop instance using the metal layer class definition;

a defining mechanism configured to define a flip-flop type for each flip-flop instance;

an associating mechanism configured to associate the flip-flop with a group of other flip-flops that have a same metal layer class definition;

a searching mechanism configured to search for available flip-flop positions based on the repeater placement; and a position determining mechanism configured to determine a position for the group of flip-flops by replacing an existing repeater in the integrated circuit with the group of flip-flops.

10. The apparatus of claim 9, further comprising:

a extracting mechanism configured to extract resistor-capacitor (RC) parasitic data for each I/O pin of each block on the integrated circuit; and a data using mechanism configured to use the RC parasitic data to determine signal timing at each I/O pin.

11. The apparatus of claim 10, further comprising a calculating mechanism configured to calculate a wire delay for each I/O signal line used for interconnecting blocks on the integrated circuit.

12. The apparatus of claim 11, wherein calculating the wire delay for each I/O signal line involves using a wire parasitic equation.

* * * * *